(12) United States Patent
Lee et al.

(10) Patent No.: US 9,053,932 B2
(45) Date of Patent: Jun. 9, 2015

(54) METHODS OF PREPARING GRAPHENE AND DEVICE INCLUDING GRAPHENE

(71) Applicant: Samsung Electronics Co., Ltd., Suwon-Si, Gyeonggi-Do (KR)

(72) Inventors: Dong Wook Lee, Suwon-si (KR); Hyeon-jin Shin, Suwon-si (KR); Seong-jun Park, Seoul (KR); Kyung-eun Byun, Uijeongbu-si (KR); David Seo, Yongin-si (KR); Hyun-jae Song, Hwaseong-si (KR); Yun-sung Woo, Suwon-si (KR); Jae-ho Lee, Seoul (KR); Hyun-jong Chung, Hwaseong-si (KR); Jin-seong Heo, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 2 days.

(21) Appl. No.: 13/917,786

(22) Filed: Jun. 14, 2013

(65) Prior Publication Data

US 2014/0141600 A1    May 22, 2014

(30) Foreign Application Priority Data

Nov. 21, 2012    (KR) .......................... 10-2012-0132603

(51) Int. Cl.

| H01L 21/20 | (2006.01) |
|---|---|
| H01L 21/36 | (2006.01) |
| C01B 31/04 | (2006.01) |
| H01L 21/02 | (2006.01) |
| H01L 29/16 | (2006.01) |

(52) U.S. Cl.
CPC ....... *H01L 21/02527* (2013.01); *H01L 29/1606* (2013.01); *H01L 21/0242* (2013.01); *H01L 21/02529* (2013.01); *H01L 21/02612* (2013.01); *H01L 21/02656* (2013.01)

(58) Field of Classification Search
CPC ...................... H01L 21/02527; H01L 29/1606
USPC ................ 977/734; 427/228, 249.6; 423/448, 423/445 R; 438/478
See application file for complete search history.

(56) References Cited

U.S. PATENT DOCUMENTS

| 2009/0110627 A1* | 4/2009 | Choi et al. ................. 423/447.1 |
| 2009/0155561 A1* | 6/2009 | Choi et al. .................... 428/220 |

(Continued)

FOREIGN PATENT DOCUMENTS

| KR | 20100055098 A | 5/2010 |
| KR | 20110109680 A | 10/2011 |

OTHER PUBLICATIONS

Hofrichter, J. et al. "Synthesis of Graphene in Silicon Dioxide by a Solid Carbon Source", Nano Lett. 2010, 10, pp. 36-42.*

Juang, ZY. et al. "Synthesis of graphene on silicon carbide substrates at low temperature", Carbon 2009, 47, pp. 2026-2031.*

(Continued)

*Primary Examiner* — Mary Wilczewski
*Assistant Examiner* — Erik T Peterson
(74) *Attorney, Agent, or Firm* — Harness, Dickey & Pierce, P.L.C.

(57) ABSTRACT

A method of preparing graphene includes forming a silicon carbide thin film on a substrate, forming a metal thin film on the silicon carbide thin film, and forming a metal composite layer and graphene on the substrate by heating the silicon carbide thin film and the metal thin film.

16 Claims, 4 Drawing Sheets

(56) References Cited

U.S. PATENT DOCUMENTS

| | | | |
|---|---|---|---|
| 2009/0294759 A1* | 12/2009 | Woo et al. .................. 257/29 |
| 2011/0033677 A1* | 2/2011 | Shin et al. ................. 428/201 |
| 2011/0042687 A1* | 2/2011 | Chu et al. .................. 257/77 |
| 2011/0129675 A1* | 6/2011 | Choi et al. ................. 428/408 |
| 2012/0068157 A1* | 3/2012 | Kub ........................... 257/15 |
| 2012/0112164 A1  | 5/2012 | Chu et al. |
| 2012/0161098 A1* | 6/2012 | Hiura et al. ................ 257/9 |
| 2012/0258587 A1* | 10/2012 | Kub et al. .................. 438/610 |
| 2013/0127023 A1* | 5/2013 | Zenasni ...................... 257/635 |

OTHER PUBLICATIONS

S.K. Jerng, Nanocrystalline Graphite Growth on Sapphire by Carbon Molecular Beam Epitaxy, ACS Publications 2011 American Chemical Society, p. 4491-4494.

Ariel Ismach, Direct Chemical Vapor Deposition of Graphene on Dielectric Surfaces, 2010 American Chemical Society, p. 1542-1548.

Kongara M. Reddy, High Quality, Transferrable Graphene Grown on Single Crystal Cu(111) Thin Films on Basal-Plane Sapphire, American Institute of Physics 2011, Applied Physics Letters.

* cited by examiner

METHODS OF PREPARING GRAPHENE AND DEVICE INCLUDING GRAPHENE

CROSS-REFERENCE TO RELATED APPLICATIONS

This application claims the benefit of Korean Patent Application No. 10-2012-0132603, filed on Nov. 21, 2012, in the Korean Intellectual Property Office, the disclosure of which is incorporated herein in its entirety by reference.

BACKGROUND

1. Field

Example embodiments relate to methods of preparing graphene and a device including graphene.

2. Description of the Related Art

Graphene has a hexagonal structure formed of carbon atoms and may have structural/chemical stability, and exhibit desirable electrical and physical characteristics. For example, graphene has a charge mobility of less than about $2 \times 10^5$ $cm^2/Vs$ which is more than 100 times faster than the one of silicon and a current density of about $10^8$ $A/cm^3$ which is more than 100 times greater than the one of copper (Cu). Also, graphene has transmittance and may exhibit quantum characteristics at room temperature. Graphene is attracting attention as a next generation material capable of overcoming the limitations of related art materials.

However, preparing a device including graphene is not easy in practice due to limitations in graphene preparation. Because a related art graphene transition method uses expensive electron beam resist polymethylmethacrylate (PMMA) equipment, the practicability of graphene is reduced in terms of costs.

SUMMARY

Example embodiments provide a method of preparing graphene. Example embodiments also provide methods of preparing a device including graphene.

Additional aspects will be set forth in part in the description which follows and, in part, will be apparent from the description, or may be learned by practice of example embodiments.

According to example embodiments, a method of preparing graphene includes forming a silicon carbide thin film on a substrate, forming a metal thin film on the silicon carbide thin film, and forming a metal composite layer and graphene on the substrate by heating the silicon carbide thin film and the metal thin film.

The graphene may be formed between the substrate and the metal composite layer. The silicon carbide thin film and the metal thin film may be heated at a temperature in a range of about 1000° C. to about 1100° C. for about 0.5 hour to about 2 hours.

The metal thin film may include at least one of palladium (Pd), copper (Cu), iron (Fe) and manganese (Mn). The silicon carbide thin film may be one of polycrystalline and amorphous.

The substrate may be formed of an insulation material. The substrate may be formed of an oxide. The substrate may include at least one of sapphire ($Al_2O_3$), lanthanum aluminate ($LaAlO_3$) and strontium titanium oxide ($SrTiO_3$).

The graphene may include a D-peak, a G-peak and a 2D-peak. The silicon carbide thin film may have a same thickness as the metal thin film. Thicknesses of the silicon carbide and the metal thin film may be about 1 nm to about 10 nm.

The silicon carbide thin film and the metal thin film may be heated in a vacuum state. A vacuum degree of the vacuum state may be in a range of about $10^{-4}$ to about $10^{-3}$ Torr.

The metal composite layer may be formed by bonding silicon of the silicon carbide thin film and a metal of the metal thin film. The graphene may be formed by bonding carbons of the silicon carbide thin film. The method may further include removing the metal composite layer.

According to example embodiments, a method of fabricating a device includes forming a device including graphene on a substrate by preparing the graphene in accordance with example embodiments.

Forming the device may include patterning the graphene. The device may be one of a display device and an electronic device.

According to example embodiments, a method of preparing graphene includes forming a metal composite layer and graphene on an insulation substrate by heating a silicon carbide thin film and a metal thin film in a vacuum state.

A vacuum degree of the vacuum state may be in the range of about $10^{-4}$ to about $10^{-3}$ Torr. The silicon carbide thin film and the metal thin film may be heated at a temperature in a range of about 1000° C. to about 1100° C. The silicon carbide thin film and the metal thin film may be heated for about 0.5 hour to about 2 hours. The insulation substrate may include at least one of sapphire ($Al_2O_3$), lanthanum aluminate ($LaAlO_3$) and strontium titanium oxide ($SrTiO_3$).

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1A:
FIGS. 1A to 1E illustrate a method of preparing graphene according to example embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. In the drawings, the thicknesses of layers and regions are exaggerated for clarity. It will also be understood that when a layer is referred to as being "on" another layer or substrate, it can be directly on the other layer or substrate, or intervening layers may also be present. As used herein, the term "and/or" includes any and all combinations of one or more of the associated listed items. Expressions such as "at least one of," when preceding a list of elements, modify the entire list of elements and do not modify the individual elements of the list.

The term "graphene" in this disclosure indicates that polycyclic aromatic molecules form a sheet in which a plurality of carbon atoms in the polycyclic aromatic molecules are interconnected with each other through covalent bonding. The graphene is also distinguished from a carbon nanotube having a cylindrical shape structure. The carbon atoms interconnected through the covalent bonding form a 6-membered ring as a basic repetition unit and may further include a 5-membered ring and/or a 7-membered ring. Accordingly, the graphene looks like a single layer of covalently bonded carbon atoms, normally $sp^2$ bonded. The graphene may be formed of a single graphene layer or may be formed by laminating a plurality of graphene layers up to a maximum of 300 layers. Normally a side end portion of the graphene is saturated with hydrogen atoms.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1A to 1E illustrate a method of preparing the graphene.

As illustrated in FIG. 1A, a substrate 10 is prepared. The substrate 10 may be formed of an insulation material. For example, the insulation material may be an insulation oxide (e.g., sapphire ($Al_2O_3$)), lanthanum aluminate ($LaAlO_3$), and strontium titanium oxide ($SrTiO_3$)). The thickness of the substrate 10 may be under several mm. For example, the substrate 10 may have a thickness of about 1 mm to about 10 mm.

Figure 1B:
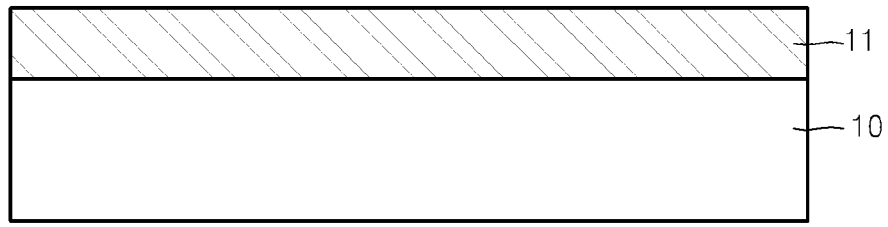

As illustrated in FIG. 1B, a silicon carbide (SiC) thin film 11 is formed on the substrate 10. The silicon carbide thin film 11 may be deposited on the substrate 10 by using a chemical vapor deposition (CVD) process. The silicon carbide thin film 11 may be deposited at room temperature. Because the silicon carbide thin film 11 is deposited at a relatively low temperature, for example, room temperature, the deposited silicon carbide thin film 11 may be amorphous. Alternatively, the silicon carbide thin film 11 may be polycrystalline. The thickness of the silicon carbide thin film 11 may be several nm. For example, the silicon carbide thin film 11 may have a thickness of 1 nm to 10 nm.

Figure 1C:
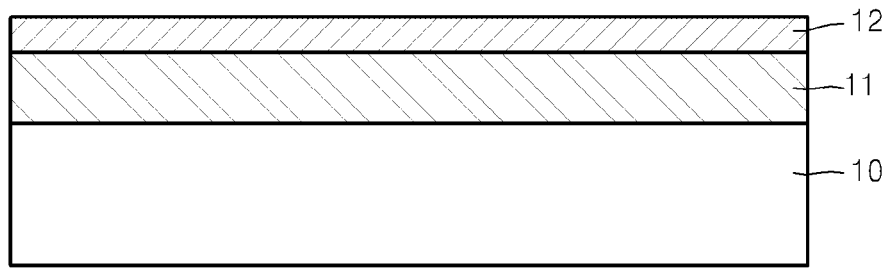

As illustrated in FIG. 1C, a metal thin film 12 is formed on the silicon carbide thin film 11. The metal thin film 12 may be formed of a metal (e.g., palladium (Pd), Copper (Cu), Iron (Fe), or Manganese (Mn)). The metal thin film 12 may be deposited by using a method, e.g., atomic layer deposition (ALD), CVD or physical vapor deposition (PVD). The deposition of the metal thin film 12 may be performed at room temperature. The metal thin film 12 may be deposited uniformly on the silicon carbide thin film 11. Also, the metal thin film 12 may be formed to have a same thickness as the silicon carbide thin film 11. For example, the thickness of the metal thin film 12 may be about 1 nm to about 10 nm.

Figure 1D:
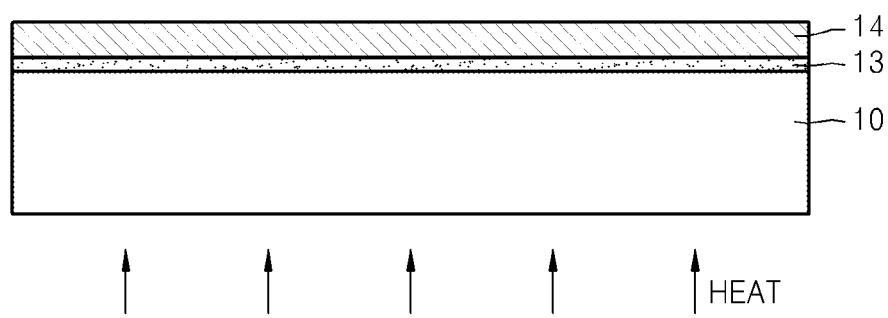

As illustrated in FIG. 1D, the substrate 10 on which the silicon carbide thin film 11 and the metal thin film 12 are formed may be heated. The heat temperature may be in the range of about 1000° C. to about 1100° C. The heat process may be performed in a vacuum state. A vacuum degree of the vacuum state may be several mTorr. For example, the vacuum degree may be about $10^{-4}$ Torr to about $10^{-3}$ Torr. A heat process duration may be formed about 30 minutes to about 2 hours, which may vary according to the thicknesses of the silicon carbide thin film 11 and metal thin film 12.

A heat source of the heat process may be induction heating, radiation heating, a laser, infrared rays, plasma, ultraviolet rays, or surface or plasmon heating, but is not limited thereto. These heat sources may be attached to a chamber (not shown) where the substrate 10, on which the silicon carbide thin film 11 and the metal thin film 12 are formed, is disposed and a temperature of the inside of the chamber may be raised to a predetermined or given temperature.

The silicon in the silicon carbide thin film 11 is separated from carbon, bonds to the metal in the metal thin film 12, and forms a metal composite layer 14, which is a metal-silicidation process. When the metal thin film is formed of palladium (Pd), a material of the metal composite layer 14 is $Pd_2Si$.

When the metal thin film is formed of copper (Cu), a material of the metal composite layer 14 is $Cu_5Si$. When the metal thin film is formed of iron (Fe), a material of the metal composite layer 14 is $Fe_3Si$. When the metal thin film is formed of manganese (Mn), a material of the metal composite layer 14 is $Mn_3Si$.

The remaining carbons bond together to form graphene layer 13. The graphene layer 13 may be formed between the substrate 10 and the metal composite layer 14.

A resulting product obtained from the foregoing heating process proceeds to a cooling process. The cooling process causes the formed graphene layer 12 to grow uniformly and to be cooled at a speed of about 10° C. per minute to about 100° C. per minute. In the cooling process, natural cooling may be employed. For the natural cooling, stopping an operation of a heat source or removing a heat source from a reactor may be employed.

Figure 1E:
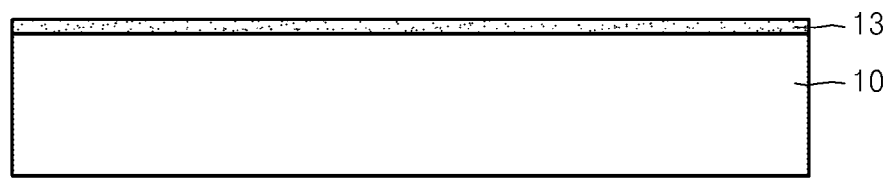

As illustrated in FIG. 1E, the graphene layer 13 on the substrate 10 may be obtained by removing the metal composite layer 14. The metal composite layer 14 may be removed by etching.

Although the above described graphene preparation processes may be performed in a single cycle, graphene having a compact structure as well as many layers may also be obtained by repeating the processes several times.

The crystallinity of the directly grown graphene on the silicon carbide thin film may be measured by using Raman spectroscopy. Normally the graphene may have a G-peak around 1590 $cm^{-1}$ in the Raman spectrum, a D-peak around 1350 $cm^{-1}$, and a 2D-peak around 2700 $cm^{-1}$.

The D-peak is caused by an internal defect of the graphene, and is mainly observed around an edge of a sample or in a case of many defects in the sample. Accordingly, when an intensity of the D-peak is higher, the graphene may have lots of defects and crystallinity thereof may be relatively low. On the contrary, when the intensity of the D-peak is low, the graphene may have a relatively low amount of defects and the crystallinity thereof may be relatively high.

The G-peak and 2D-peak are commonly found in a graphite material and are expressed due to interactions between carbon atoms. In the Raman spectroscopy, the number of graphene layers may be distinguished by the 2D-peak intensity over the G-peak intensity. Although there is little difference according to a wavelength of a laser, when the 2D-peak intensity over the G-peak intensity is greater than 1, there is normally one graphene layer. When the 2D-peak intensity over the G-peak intensity is 1, there are two graphene layers. When the 2D-peak intensity over the G-peak intensity is smaller than 1, there are more than 3 graphene layers. Therefore, the graphene layers may be distinguished by using the 2D-peak shape. The quality and the thickness of the graphene layer may be more easily determined by this relatively easy non-destructive inspection using the Raman spectroscopy. A ratio of 2D-peak intensity over the G-peak intensity of the graphene grown according to example embodiments may be more than 0.5.

In relation to FIGS. 1A to 1E, the metal thin film may be formed after the silicon carbide thin film is formed on the substrate, but the present inventive concepts are not limited thereto. The graphene may be prepared by forming the metal thin film on the substrate, and then forming the silicon carbide thin film and performing a heating process.

Hereinafter example embodiments will be described in detail, but the present inventive concepts are not limited thereto.

A silicon carbide thin film and a palladium thin film were deposited to have the thickness of 5 nm respectively on a sapphire substrate. The sapphire substrate on which the silicon carbide thin film and the palladium thin film were deposited was disposed in a furnace of which a vacuum degree was about $10^{-3}$ Torr and heated at various temperatures of about 950° C., about 1050° C. and about 1150° C. for an hour to grow graphene.

Figure 2:
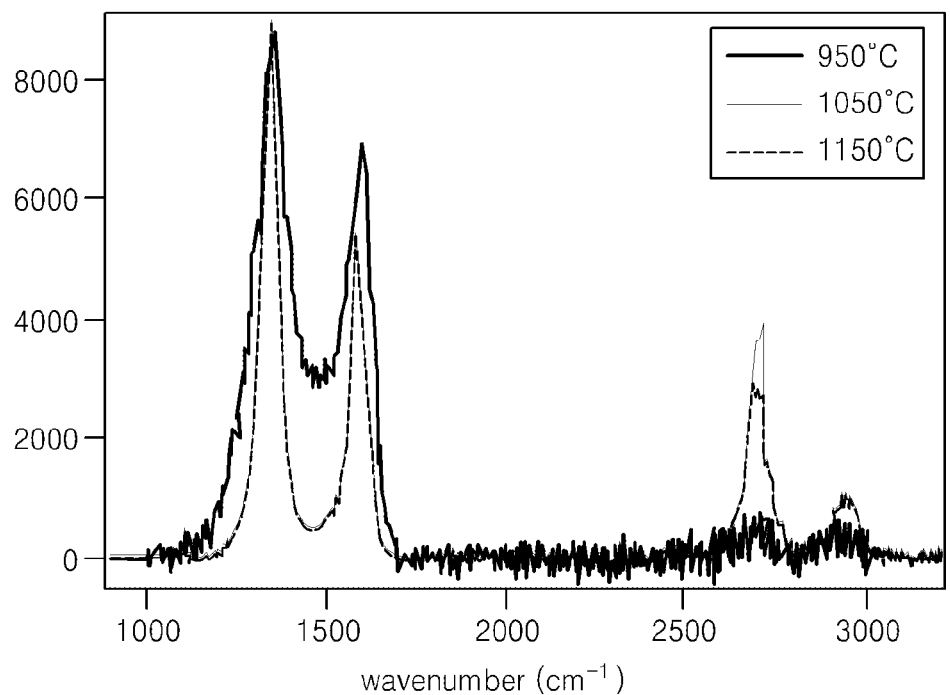
FIG. 2 illustrates a result of Raman spectroscopic analysis of a product according to example embodiments.

FIG. 2 illustrates a result of Raman spectroscopic analysis of the product prepared according to example embodiments. Referring to FIG. 2, because a 2D-peak is expressed around 2,700 $cm^{-1}$, the graphene exists. When the heating temperature is about 950° C., all of a D-peak, a G-peak and the 2D-peak appear. However, the 2D-peak intensity is smaller than the G-peak intensity. When the heating temperature is about 1050° C., the 2D-peak intensity becomes greater. When the heating temperature is about 1150° C., the 2D-peak intensity reduces. Accordingly, the graphene begins to grow at about 950° C., and the crystallinity of the grown graphene lowers at more than about 1150° C. Finally, the heating temperature for growing the graphene is in a range of about 950° C. to about 1150° C., and a graphene of higher crystallinity may be obtained at a temperature range of about 1000° C. to about 1100° C.

Figure 3:
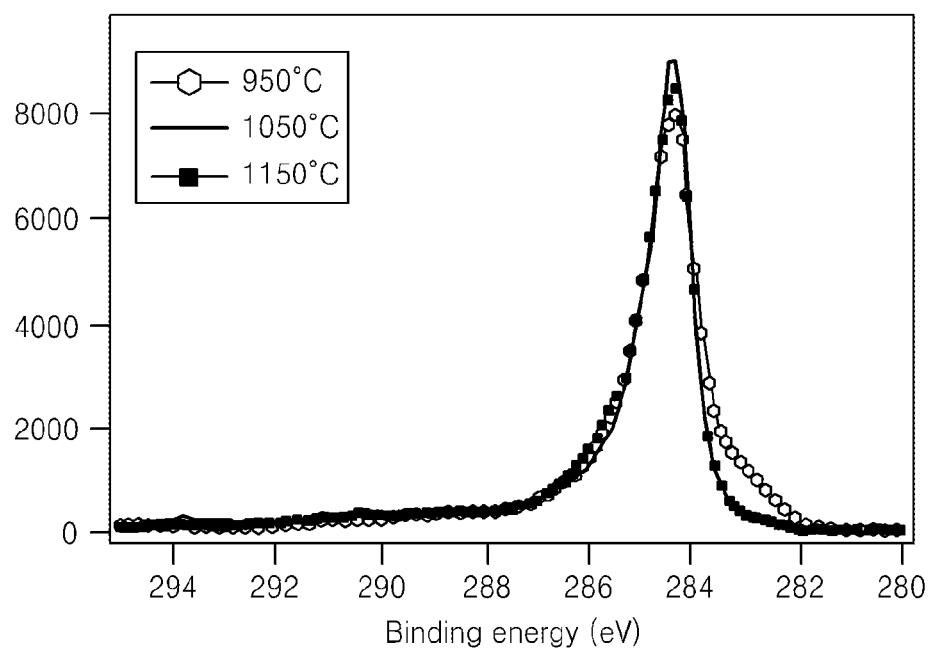
FIG. 3 illustrates a result of X-ray photoelectron spectroscopic (XPS) analysis of a product according to example embodiments.

FIG. 3 illustrates a result of X-ray photoelectron spectroscopic (XPS) analysis of a product prepared according to example embodiments. In general, the binding energy of the graphene is about 285 eV, and the binding energy of the silicon carbide is about 283.5 eV. Regarding the product heated at about 1050° C. and about 1150° C., only a peak is found around 285 eV but a peak is not found around 283.5 eV. On the contrary, regarding the product heated at about 950° C., a peak is also found around 283.5 eV. Accordingly, silicon carbide which does not react remains in the product heated at about 950° C., and all the silicon carbide reacts and becomes a metal composite in the graphene sample heated at about 1050° C. and about 1150° C.

As described above, because the graphene may be grown from the silicon carbide thin film and metal of the metal thin film on the substrate under a relatively high pressure and a low temperature, preparation thereof is simplified.

The graphene prepared as described above may be used to prepare a device to which the graphene is applied. For example, the graphene may be patterned in a predetermined or given shape and then various devices may be prepared including the patterned graphene on a substrate.

Graphene may be usefully adopted as a transparent electrode due to desirable conductivity and relatively high film uniformity. In a solar cell, an electrode may be used on a substrate and the electrode may be transparent due to the necessity of a light transmitting property. The graphene used for the transparent electrode shows desirable conductivity. When the graphene is used for a panel conductive thin film of various display devices, desired conductivity may be achieved even with a relatively small amount thereof, and thus, light transmission may be improved.

The graphene may also be used for a channel for a memory device, a sensor or electronic paper. Namely, the graphene exists on an insulation layer, which is used as a gate electrode of various transistors, for example, a field effect transistor (FET).

The graphene may be also applied to a display device employing the transparent electrode. The display device may be an electronic paper display device, an organic light emitting device or a liquid crystal display (LCD).

Among them, the organic light emitting device is an active light emitting type display device which uses a phenomenon whereby when a current is applied to a fluorescent or phosphorous organic compound thin film, holes and electrons combine to emit light. A general organic light emitting field effect device has an anode formed on an upper surface of a substrate, and a hole transport layer (HTL), a light emitting layer, an electron transport layer (ETL) and a cathode are sequentially formed on an upper surface of the anode. In order to more easily inject the electrons and holes, an electron injecting layer (EIL) and a hole injecting layer (HIL) may be further included, and if necessary, a hole blocking layer (HBL) and a buffer layer may be further included. The anode is desirably made of a transparent material having desirable conductivity and the graphene as described above may be appropriate in this regard.

According to another implementation example, the graphene may be used for various electronic devices, for example, a sensor, a bipolar junction transistor (BJT), a FET, a heterojunction bipolar transistor (HBT), a single electron transistor (SET), a light emitting diode (LED), or an organic field effect light emitting diode. In these devices, the graphene may be used as a channel layer, an electrode or a buffer layer between the electrode and the channel layer.

Figure 4:
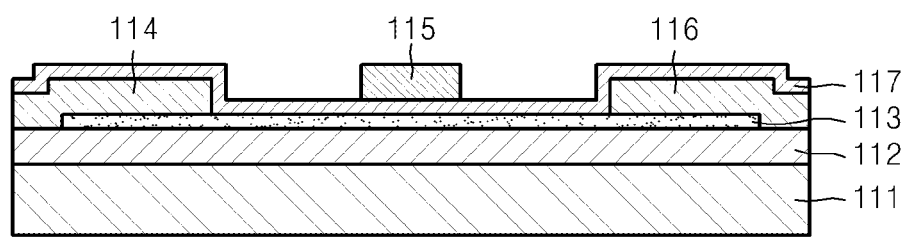
FIG. 4 illustrates a schematic diagram of a field effect transistor (FET) including substrate type graphene.

An example of a FET is illustrated in FIG. 4. Referring to FIG. 4, a silica substrate 112 may be formed on a substrate 111, a graphene 113 may be disposed on the silica substrate 112 as a channel layer, a source electrode 114 and a drain electrode 116 may be disposed on the left and right sides, and a gate electrode 115 may be interposed between an insulation layer 117. Here, a current flowing between the source-drain electrodes 114 and 116 may be controlled by applying a voltage to the gate electrode 115. Namely, the graphene 113 forms a channel region and the transistor is turned on or off by controlling the current flowing between the source and drain electrodes 114 and 116 with the voltage applied to the gate electrode 115.

Here, an interval between the source and drain electrodes 114 and 116 is determined to be, for example, about 0.1 µm to about 1 mm, about 1 µm to about 100 µm, or about 5 µm to about 100 µm according to a use of a thin film transistor (TFT).

In the transistor according to example embodiments, a material of the insulation layer 117 is not particularly limited, but has an electrical insulation property and is capable of forming a thin film. The material may also be a material having electrical resistivity of more than about 10 Ωcm at room temperature, for example, a metal oxide including silicon oxide, a metal nitride including silicon nitride, a polymer, a low molecular organic compound, and may also adopt an inorganic oxide film having higher relative permittivity as an example.

The inorganic oxide may be silicon oxide, aluminum oxide, tantalum oxide, titanium oxide, tin oxide, vanadium oxide, barium strontium titanate, barium zirconate titanate, lead zirconate titanate, lead lanthanum titanate, strontium titanate, barium titanate, barium magnesium fluoride, lanthanum oxide, fluorine oxide, magnesium oxide, bismuth oxide, bismuth titanate, niobium oxide, strontium bismuth titanate, strontium bismuth tantalate, tantalum pentoxide, bismuth tantalate niobate, yttrium trioxide and combinations thereof, for example, silicon oxide, aluminum oxide, tantalum oxide and titanium oxide.

An inorganic nitride, for example, silicon nitride ($Si_3N_4$, $Si_xN_y$, where x, y>0) or aluminum nitride, may also be suitably used for the inorganic oxide.

The insulation layer may be formed of a precursor including metal alkoxide by coating a substrate with a solution of this precursor, and performing a chemical solution process including heating.

The metal in the metal alkoxide may be selected from among a transition metal, lanthanoid or representative element, and may be barium (Ba), strontium (Sr), titanium (Ti), bismuth (Bi), tantalum (Ta), zirconium (Zr), iron (Fe), Nickel (Ni), Manganese (Mn), lead (Pb), lanthanum (La), lithium (Li), sodium (Na), potassium (K), rubidium (Rb), cesium (Cs), francium (Fr), beryllium (Be), magnesium (Mg), calcium (Ca), niobium (Nb), thalium (Tl), mercury (Hg), copper (Cu), cobalt (Co), rhodium (Rh), scandium (Sc), and/or yttrium (Y).

The alkoxide in the metal alkoxide may be derived from alcohols including methanol, ethanol, propanol, isopropanol, butanol, and/or isobutanol, and alkoxy alcohols including methoxy ethanol, ethoxy ethanol, propoxy ethanol, butoxy ethanol, pentoxy ethanol, heptoxy ethanol, methoxy propanol, ethoxy propanol, propoxy propanol, butoxy propanol, pentoxy propanol, and/or heptoxy propanol.

When the insulation layer is formed of the above described material according to example embodiments, polarization in the insulation layer is more easily facilitated, thereby reducing a threshold operation voltage of the transistor. When the insulation layer is formed of silicon nitride (e.g., $Si_3N_4$, $Si_xN_y$, $SiON_x$, where x, y>0), among the materials, a depletion layer may be more easily formed and the operation threshold voltage of the transistor may be further reduced.

As the insulating layer using an organic compound, polyimide, polyamide, polyester, polyacrylate, a photocurable resin of a photoradical polymer type or a photo cationic polymer type, a copolymer containing an acrylonitrile component, polyvinyl phenol, polyvinyl alcohol, a novolak resin, and/or cyanoethyl pullulan may be used.

In addition, a wax, polyethylene, polychloropyrene, polyethylene terephthalate, polyoxymethylene, polyvinyl chloride, poly fluoro vinylidene, polymethylmethacrylate, polysulfone, polycarbonate, polyimide cyanoethyl pullulan, poly(vinyl phenol) (PVP), poly(methyl methacrylate) (PMMA), polycarbonate (PC), polystyrene (PS), polyolefin, polyacrylamide, poly(acrylic acid), a novolak resin, a resol resin, polyimide, polyxylene, an epoxy resin, a polymer material having a relatively high dielectricity (e.g., pullulan) may be used.

The insulation layer may be a mixed layer using inorganic or organic compound materials or a laminated structure thereof. In example embodiments, performance of the device may be controlled by mixing or laminating materials having relatively high permittivity and relatively high water repellency.

As a method of forming the insulating layer, a dry process, for example, a vacuum deposition, molecular beam epitaxial growth, ion cluster beam deposition, a low energy ion beam method, ion plating, CVD, sputtering, an atmospheric plasma method, etc., a coating method such as spray coating, spin coating, blade coating, dip coating, casting coating, roll coating, bar coating, or dye coating, or a wet process, for example, print-patterning or inkjet-patterning, may be used according to the material. As the wet process, a method in which a solution is coated and then dried may be used. The solution may be made from fine particles of an inorganic oxide which are dispersed in any organic solvent or in water using dispersion aids, for example, a surfactant, if necessary. Alternatively, a so-called sol-gel method in which a precursor of an oxide, for example, an alkoxide solution, is coated and dried may be used.

A metal atom layer and/or a metal ion layer may be further formed between the graphene layer, which is a semiconductor layer, and the insulation layer. The metal atom layer may include Zn, Al, Ga, Zr, Ni, Co, Pd or any mixtures thereof. The metal ion layer may include Zn, Al, Ga, Zr, Ni, Co, Pd or any mixtures thereof, which may exist as a metal salt type. As a corresponding ion to the metal salt, halogen, $(COOH)^-$, $(NO3)^{2-}$, $(SO4)^{2-}$, and/or $(CO3)^{2-}$ may be used. The metal atom layer or the metal ion layer may have a thickness such that the metal atoms or the metal ions are laminated in 1 to 3 layers.

The metal atom layer or the metal ion layer may be formed by using a method known in the art, for example, a dry process, for example, vacuum deposition, molecular beam epitaxial growth, ion cluster beam deposition, a low energy ion beam method, ion plating, CVD, sputtering, or an atmospheric plasma method, a coating method, for example, spray coating, spin coating, blade coating, dip coating, casting coating, roll coating, bar coating, or dye coating, or a wet process, for example, print-patterning or inkjet-patterning, according to the material, but is not limited thereto.

A substrate in the transistor, for example, in the TFT, supports the TFT structure. As a material of the substrate, an inorganic compound, for example, a metal oxide or a nitride, a plastic film, for example, PET, PES, PC, or a metal substrate, or composite or laminate thereof may be used. In addition, when another component other than the substrate may sufficiently support the TFT structure, the substrate may be removed. As a material of the substrate, a silicon (Si) wafer may be used in many cases. In example embodiments, Si itself may be used as a gate electrode and the substrate. It is also possible to oxidize a surface of Si to form $SiO_2$, and then adopt the same for the insulation layer. In example embodiments, a metal layer (e.g., Au) is formed as a lead line connection electrode on the Si substrate, thus forming the substrate and the gate electrode.

In the transistor according to example embodiments, materials for a gate electrode, a source electrode and a drain electrode are not limited so long as they are a conductive material. The materials may be platinum, gold, silver, nickel, chromium, copper, iron, tin, antimony, lead, tantalum, indium, palladium, tellurium, rhenium, iridium, aluminum, ruthenium, germanium, molybdenum, tungsten, lead antimony, indium-tin oxide (ITO), fluorine doped zinc oxide, zinc, carbon, graphite, glassy carbon, silver paste, carbon paste, lithium, beryllium, sodium, magnesium, potassium, calcium, scandium, titanium, manganese, zirconium, gallium, niobium, sodium-potassium alloy, a magnesium/copper mixture, a magnesium/silver mixture, a magnesium/aluminum mixture, a magnesium/indium mixture, an aluminum/aluminum oxide mixture, and/or a lithium/aluminum mixture. When using these materials, the electrode may be formed by forming a film using a sputter method or a vacuum deposition method.

In the transistor according to example embodiments, the source and drain electrodes may be formed of an electrode material having liquidity, for example, a solution including the above-described conductive material, a paste, an ink, and/or a dispersion solution. As a dispersion material including metal fine particles, a known conductive paste may be used. The dispersion material may include metal fine particles having a particle diameter of about 0.5 nm to about 50 nm or about 1 nm to about 10 nm. The metal fine particles may be formed of platinum, silver, nickel, chromium, copper, iron, tin, lead antimony, tantalum, indium, palladium, tellurium, rhenium, iridium, aluminum, ruthenium, germanium, molybdenum, tungsten and/or zinc.

The electrode may be formed using a dispersion in which the metal fine particles are dispersed in water or in a dispersion medium of any organic solvent using a dispersion stabilizer which mainly includes organic materials. The dispersion including the metal fine particles may be prepared by using a physical generation method, for example, a sputtering method or metal vapor synthesis, or a chemical generation method, for example, a colloidal method or co-precipitation, which generates the metal fine particles by reducing metal ions in a liquid phase.

An electrode pattern having a desired shape may be formed by molding the electrode using the metal fine particle dispersion, drying the solvent at a temperature in the range of about 100° C. to about 300° C., for example, about 150° C. to about 200° C., if necessary, and then thermally bonding the metal fine particles.

As a material of the gate electrode, the source electrode and the drain electrode, a known conductive polymer whose conductivity is improved by doping may be used. For example, conductive polyaniline, conductive polypyrrole, conductive polythiophene (a complex of polyethylenedioxythiophene and polystyrene sulfinic acid), a complex of polyethylenedioxythiophene (PEDOT) and polystyrene sulfonic acid may be used, as appropriate. Due to these materials, contact resistance between the source and drain electrodes and the semiconductor layer may be reduced.

As a material for forming the source and drain electrodes, a material, from among the above described materials, having a smaller electrical resistance in a surface contacting the semiconductor layer, may be used. The electrical resistance corresponds to field-effect mobility when a current-controlled device is prepared. Accordingly a material having a resistance as small as possible is desirable or necessary in order to obtain relatively high mobility.

The electrode may be formed by, for example, deposition, electron beam deposition, sputtering, atmospheric plasma treatment, ion plating, CVD, electro-deposition, electroless plating, spin coating, printing or ink-jetting. If necessary, patterning is performed by forming the electrode from the conductive thin film formed by the above described method through a known photolithography or lifting-off method, and forming a resist by heat transfer on a metal thin film of aluminum or copper and ink-jetting, and etching the resist.

In addition, patterning may be performed by directly ink-jetting a conductive polymer solution, a conductive polymer dispersion or a dispersion including metal fine particles or by lithography or laser-polishing the application film. Another patterning method of printing conductive ink or a conductive paste which includes a conductive polymer or metal fine particles by relief printing, intaglio printing, lithographic printing or screen printing may also be used.

A thickness of a film formed in this way is in the range of, for example, about 0.2 nm to about 10 μm or about 4 nm to about 400 nm when a current flows, but is not limited thereto. Within this range, a voltage drop does not occur because the resistance increases as the thickness decreases.

In the transistor according to example embodiments, a buffer layer may be formed between the semiconductor layer and the source and drain electrodes for the purpose of enhancing an injection efficiency. As the buffer layer, an alkali metal, for example, LiF, $Li_2O$, CsF, $NaCO_3$, KCl, $MgF_2$, or $CaCO_3$, which is used to form a cathode in an organic electroluminescent (EL) device, or a composite having an ionic bond with an alkaline earth metal, may be used with respect to an n-type TFT. In addition, as an EIL or an ETL in the organic EL device, a compound such as Alq(tris (8-quinolinol) aluminum complex) may be used.

The buffer layer may have an effect of lowering a threshold voltage by lowering a carrier injection barrier and driving the transistor using a relatively low voltage. The buffer layer may be thinly interposed between the electrodes and the semiconductor layer and the thickness thereof may be in the range of about 0.1 nm to about 30 nm or about 0.3 nm to about 20 nm.

When a light emitting device is electrically connected to the TFT, the light emitting device may be controlled by using a current flowing between the source-drain electrodes. The TFT may be included in a flat panel display device.

As described above, according to example embodiments, because the graphene is directly formed on the insulation substrate, a latch-up effect does not occur even though a device including the graphene is formed. Because the graphene is formed by heating the silicon carbide thin film and the metal thin film in a vacuum state, preparation of the graphene is simplified. In addition, because the graphene is directly grown on an insulation substrate, and the insulation substrate on which the graphene is formed is directly applied to a device, preparation of the device including the graphene is simplified.

It should be understood that example embodiments described herein should be considered in a descriptive sense only and not for purposes of limitation. Descriptions of features or aspects within each embodiment should typically be considered as available for other similar features or aspects in other example embodiments.

What is claimed is:

1. A method of preparing graphene comprising:
    forming a silicon carbide thin film on a substrate;
    forming a metal thin film on the silicon carbide thin film; and
    forming a metal silicide layer and graphene on the substrate by heating the silicon carbide thin film and the metal thin film,
    wherein the forming a metal silicide layer and graphene includes heating the silicon carbide thin film and the metal thin film at a temperature between 1000° C. and 1100° C. in a vacuum state in the range of $10^{-4}$ to $10^{-3}$ Torr, and
    wherein the metal thin film includes at least one of palladium (Pd) and manganese (Mn).

2. The method according to claim 1, wherein the forming graphene forms the graphene between the substrate and the metal silicide layer.

3. The method according to claim 1, wherein the forming a metal silicide layer and graphene includes heating the silicon carbide thin film and the metal thin film for 0.5 hour to 2 hours.

4. The method according to claim 1, wherein the forming a silicon carbide thin film forms one of a polycrystalline silicon carbide thin film and an amorphous silicon carbide thin film.

5. The method according to claim 1, wherein the substrate is formed of an insulation material.

6. The method according to claim 1, wherein the substrate is formed of an oxide.

7. The method according to claim 1, wherein the substrate includes at least one of sapphire ($Al_2O_3$), lanthanum aluminate ($LaAlO_3$) and strontium titanium oxide ($SrTiO_3$).

8. The method according to claim 1, wherein the forming graphene includes forming the graphene having a D-peak, a G-peak and a 2D-peak.

9. The method according to claim 1, wherein the forming a metal thin film forms the metal thin film to have a same thickness as the silicon carbide thin film.

10. The method according to claim 9, wherein the thicknesses of the silicon carbide thin film and the metal thin film are 1 nm to 10 nm.

11. The method according to claim 1, wherein the forming a metal silicide layer includes bonding silicon of the silicon carbide thin film and a metal of the metal thin film.

12. The method according to claim 1, wherein the forming a graphene includes bonding carbons of the silicon carbide thin film.

13. The method according to claim 1, further comprising: removing the metal silicide layer.

14. A method of fabricating a device, the method comprising:
    forming a device including graphene on a substrate by preparing the graphene in accordance with claim 1.

15. The method according to claim 14, wherein the forming a device further comprises patterning the graphene.

16. The method according to claim 14, wherein the forming a device includes forming one of a display device and an electronic device.

* * * * *